(12) United States Patent
Lee

(10) Patent No.: US 12,266,395 B2
(45) Date of Patent: Apr. 1, 2025

(54) MEMORY DEVICE AND OPERATION METHOD THEREOF

(71) Applicant: Samsung Electronics Co., Ltd., Suwon-si (KR)

(72) Inventor: Kyo-Gil Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 18/330,404

(22) Filed: Jun. 7, 2023

(65) Prior Publication Data

US 2024/0127879 A1 Apr. 18, 2024

(30) Foreign Application Priority Data

Oct. 17, 2022 (KR) ........................ 10-2022-0132901

(51) Int. Cl.
| | | |
|---|---|---|
| *G11C 11/40* | (2006.01) | |
| *G11C 11/406* | (2006.01) | |
| *G11C 11/4078* | (2006.01) | |
| *G11C 11/4096* | (2006.01) | |
| *G11C 29/46* | (2006.01) | |

(52) U.S. Cl.
CPC .... *G11C 11/40615* (2013.01); *G11C 11/4078* (2013.01); *G11C 11/4096* (2013.01); *G11C 29/46* (2013.01)

(58) Field of Classification Search
CPC .......... G11C 11/40615; G11C 11/4078; G11C 11/4096; G11C 29/46; G11C 11/406; G11C 11/40603; G11C 11/40618; G11C 29/50016; G11C 11/40611; G11C 11/4072; G11C 11/4085; G06F 3/0604; G06F 3/0658

See application file for complete search history.

(56) References Cited

U.S. PATENT DOCUMENTS

| | | | |
|---|---|---|---|
| 8,363,496 B2 | 1/2013 | Hayashi et al. | |
| 8,687,446 B2 | 4/2014 | Lee | |
| 11,120,860 B1* | 9/2021 | Wieduwilt | ............ G11C 11/406 |
| 2019/0228813 A1* | 7/2019 | Nale | ...................... G06F 3/0659 |
| 2019/0347019 A1* | 11/2019 | Shin | ...................... G06F 3/0629 |

FOREIGN PATENT DOCUMENTS

| | | |
|---|---|---|
| JP | 2005092978 A | 4/2005 |
| JP | 2010225195 A | 10/2010 |
| JP | 2011222074 A | 11/2011 |
| KR | 20140075364 A | 6/2014 |
| KR | 102329673 B1 | 11/2021 |
| KR | 102358563 B1 | 2/2022 |

* cited by examiner

*Primary Examiner* — Xiaochun L Chen
(74) *Attorney, Agent, or Firm* — Myers Bigel, P.A.

(57) ABSTRACT

A memory device includes a memory cell array having a plurality of word lines and a plurality of common source lines therein, which constitute a row. A refresh manager is provided, which is configured to perform a refresh operation for the memory cell array. The refresh manager is further configured to: (i) initialize a count for the row of the memory cell array, (ii) transmit a refresh command to the memory cell array, (iii) write first data into the row when the refresh operation for the memory cell array is a normal refresh operation, and (iv) write second data into a row associated with a word line adjacent to a word line in which row hammering has occurred, when the refresh operation for the memory cell array is not a normal refresh operation.

20 Claims, 7 Drawing Sheets

| | | | R/H Refrsh (Target #FFFE) | | | | | |
|---|---|---|---|---|---|---|---|---|
| | | | ROW ADD | | | | | |
| | | | #0000 | #0001 | ... | #FFFD | #FFFE | #FFFF |
| CSL = 0 | BL | 0 | 0 | 0 | ... | 0 | 0 | 0 |
| | | 1 | 1 | 1 | ... | 0 | 0 | 0 |
| | | 2 | 0 | 0 | ... | 0 | 0 | 0 |
| | | 3 | 1 | 1 | ... | 0 | 0 | 0 |
| | | 4 | 0 | 0 | ... | 0 | 0 | 0 |
| | | 5 | 1 | 1 | ... | 0 | 0 | 0 |
| | | 6 | 0 | 0 | ... | 0 | 0 | 0 |
| | | 7 | 1 | 1 | ... | 0 | 0 | 0 |
| CSL = 1 | BL | 0 | 0 | 0 | ... | 0 | 0 | 1 |
| | | 1 | 0 | 0 | ... | 0 | 0 | 0 |
| | | 2 | 0 | 0 | ... | 1 | 0 | 1 |
| | | 3 | 0 | 0 | ... | 0 | 0 | 0 |
| | | 4 | 0 | 0 | ... | 1 | 0 | 1 |
| | | 5 | 0 | 0 | ... | 0 | 0 | 0 |
| | | 6 | 0 | 0 | ... | 1 | 0 | 1 |
| | | 7 | 0 | 0 | ... | 0 | 0 | 0 |
| ... | ... | ... | ... | ... | ... | ... | ... | ... |
| CSL = 126 | BL | 0 | 0 | 0 | ... | 0 | 0 | 0 |
| | | 1 | 0 | 0 | ... | 0 | 0 | 0 |
| | | 2 | 0 | 0 | ... | 0 | 0 | 0 |
| | | 3 | 0 | 0 | ... | 0 | 0 | 0 |
| | | 4 | 0 | 0 | ... | 0 | 0 | 0 |
| | | 5 | 0 | 0 | ... | 0 | 0 | 0 |
| | | 6 | 0 | 0 | ... | 0 | 0 | 0 |
| | | 7 | 0 | 0 | ... | 0 | 0 | 0 |
| CSL = 127 | BL | 0 | 0 | 0 | ... | 0 | 0 | 0 |
| | | 1 | 0 | 0 | ... | 0 | 0 | 0 |
| | | 2 | 0 | 0 | ... | 0 | 0 | 0 |
| | | 3 | 0 | 0 | ... | 0 | 0 | 0 |
| | | 4 | 0 | 0 | ... | 0 | 0 | 0 |
| | | 5 | 0 | 0 | ... | 0 | 0 | 0 |
| | | 6 | 0 | 0 | ... | 0 | 0 | 0 |
| | | 7 | 0 | 0 | ... | 0 | 0 | 0 |

MEMORY DEVICE AND OPERATION METHOD THEREOF

REFERENCE TO RELATED APPLICATION

This application claims priority under 35 U.S.C. § 119 to Korean Patent Application No. 10-2022-0132901, filed Oct. 17, 2022, the disclosure of which is hereby incorporated herein by reference.

BACKGROUND

Embodiments of the disclosure relate to memory devices that support refresh operations, and methods of operating the memory devices.

A nonvolatile memory device is a memory device in which stored data are not lost even when a power supply is cut off. Typical nonvolatile memory devices may include a NAND flash memory, a vertical NAND flash memory, a NOR flash memory, a resistive random access memory (resistive RAM), a phase-change memory, and a magnetoresistive random access memory, for example.

In contrast, a volatile memory device is a memory device in which stored data are lost when a power supply is cut off. Typical volatile memory devices may include a Static Random Access Memory (SRAM), a Dynamic Random Access Memory (DRAM), a latch, a flip-flop, and a register, for example.

A volatile memory device, such as a dynamic random access memory (DRAM), determines data based on charges stored in a capacitor. However, since the charges stored in the capacitor may leak away over time, the volatile memory device periodically performs a memory refresh operation. As manufacturing processes for manufacturing memory devices are scaled down and cause a narrowing in an interval between adjacent word lines, repeated voltage distributions on one word line may cause charges in memory cells connected to another adjacent word line to be adversely affected. For example, when one word line is repeatedly accessed, a problem known as a row hammer phenomenon may occur. As will be understood by those skilled in the art, in response to a row hammer phenomenon associated with a repeatedly accessed word line, data stored in the memory cells connected to one or more adjacent word lines may be damaged (e.g., lost).

SUMMARY

The present disclosure provides a memory device having improved reliability during refresh operations.

The present disclosure provides a method of operating a memory device having improved reliability in a refresh operation.

The present disclosure provides a method of operating a memory system having improved reliability during a refresh operation.

The present disclosure is not limited to those mentioned above and additional aspects of the present disclosure, which are not mentioned herein, will be clearly understood by those skilled in the art from the following description of the present disclosure.

According to some aspects of the present disclosure, there is provided a memory device including a memory cell array having a plurality of word lines and a plurality of column select lines therein, which constitute a row, and a refresh manager for performing a refresh operation for the memory cell array. The refresh manager is configured to: (i) initialize a count for the row of the memory cell array, (ii) transmit a refresh command to the memory cell array, (iii) write first data into the row when the refresh operation for the memory cell array is a normal refresh operation, and (iv) write second data into a word line adjacent to a word line in which row hammering occurs, when the refresh operation for the memory cell array is not a normal refresh operation.

According to some aspects of the present disclosure, there is provided a method of operating a memory device, which includes: (i) initializing a count of a row of a memory cell array including a plurality of word lines and a plurality of column select lines, which constitute the row, (ii) transmitting a refresh command to the memory cell array, (iii) writing first data, which was previously designated, into the row when a refresh operation for the memory cell array is a normal refresh operation, and (iv) writing second data into a word line adjacent to a word line in which row hammering occurs, when the refresh operation for the memory cell array is not a normal refresh operation.

According to some aspects of the present disclosure, there is provided a memory system including a memory controller, and a memory device configured to receive an operation command from the memory controller. The memory device can include a memory cell array having a plurality of word lines and a plurality of column select lines, which constitute a row, and a refresh manager that is configured to perform a refresh operation for the memory cell array. The refresh manager is configured to initialize a count for the row of the memory cell array, transmit a refresh command to the memory cell array, write first data, which was previously designated, into the row when the refresh operation for the memory cell array is a normal refresh operation, and write second data into a word line adjacent to a word line in which row hammering occurs, when the refresh operation for the memory cell array is not a normal refresh operation.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which:

FIGS. 5 and 6 are tables illustrating an operation method of a memory device according to some embodiments.

DETAILED DESCRIPTION OF THE DISCLOSURE

Figure 1:
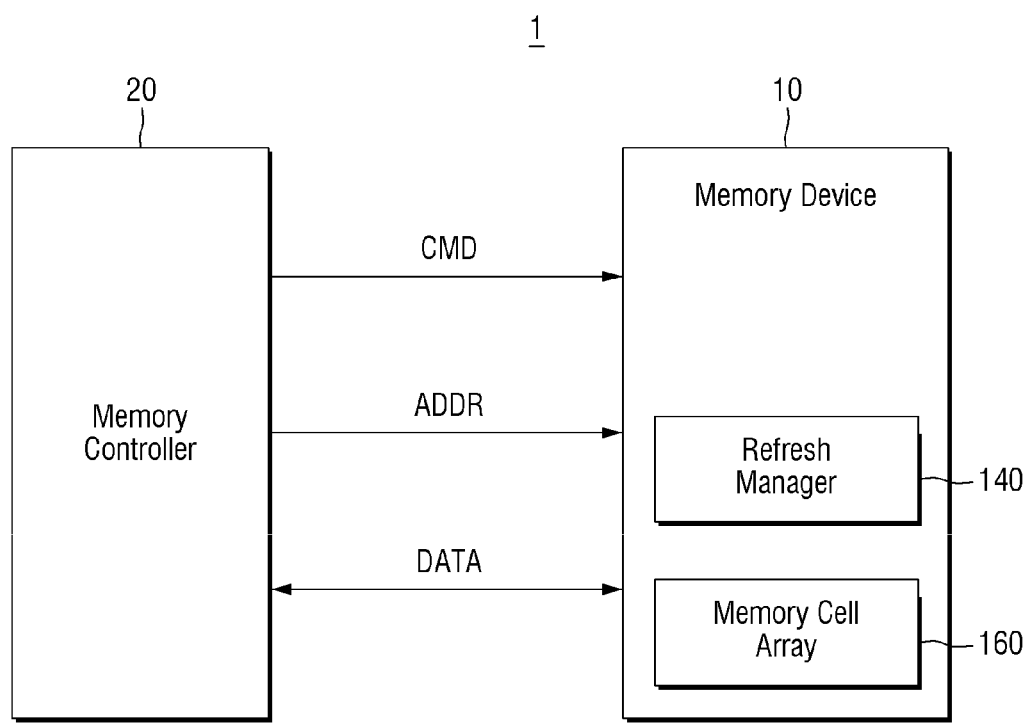
FIG. 1 is a block diagram illustrating a memory system according to some embodiments.

FIG. 1 is an exemplary block diagram illustrating a memory system according to some embodiments. Referring to FIG. 1, a memory system 1 may include a memory device 10 and a memory controller 20. The memory controller 20 may provide various signals to the memory device 10 through a memory interface to control memory operations, such as write and read operations. For example, the memory controller 20 may provide a command CMD and an address ADDR to the memory device 10 to access data DATA of a memory cell array 160. The command CMD may include an active command for a normal memory operation such as a data write operation and a data read operation, a precharge command and a refresh command for a refresh operation. The active command may mean a command for switching a state of the memory cell array 160 to an active state to write data into the memory cell array 160 or read data from the memory cell array 160, such that memory cells included in the memory cell array 160 may be driven. In the present disclosure, an access may mean that a memory cell row included in the memory cell array 160 is driven in accordance with an active command.

The precharge command may mean a command for switching the state of the memory cell array 160 from the active state to a standby state after a data write operation or a data read operation is performed. The refresh command may mean a command for performing the refresh operation for the memory cell array 160. The memory controller 20 may access the memory device 10 in accordance with a request from a host located external to the memory system 1. The memory controller 20 may perform communication with the host using various protocols.

The memory device 10 may be a storage device based on a semiconductor device. For example, the memory device 10 may be provided as a random access memory (RAM) device such as a Dynamic Random Access Memory (DRAM), a Synchronous DRAM (SDRAM), a Static RAM (SRAM), a Double Data Rate SDRAM (DDR SDRAM), a DDR2 SDRAM, a DDR3 SDRAM, a Phase-change RAM (PRAM), a Magnetic RAM (MRAM) and a Resistive RAM (RRAM). In addition, a random memory device that requires the refresh operation may be applied to the memory device 10. For example, when a resistive memory device that is a nonvolatile memory performs the refresh operation, the memory device 10 may be a nonvolatile memory device. The memory device 10 may receive or output data DATA through data lines or perform the refresh operation in response to the address ADDR and the command CMD, which are received from the memory controller 20. The memory device 10 may include a refresh manager 140 and a memory cell array 160.

The refresh manager 140 may perform a row hammer handling operation or a normal refresh operation. When the refresh manager 140 determines to perform the row hammer handling operation, the refresh manager 140 may refresh an address corresponding to an adjacent memory cell row. When the refresh manager 140 determines to perform the normal refresh operation, the refresh manager 140 may sequentially refresh a plurality of memory cell rows of the memory cell array 160.

The memory cell array 160 may include a plurality of memory cells. The plurality of memory cells may be positioned at points where a plurality of word lines cross a plurality of bit lines. The plurality of memory cells are connected to the plurality of word lines and the plurality of bit lines. Each of the plurality of memory cells may be provided in a matrix form. In the present disclosure, the memory cell row may mean memory cells included in one row among the plurality of memory cells. The plurality of word lines may be respectively connected to the plurality of memory cell rows of the memory cell array 160.

Figure 2:
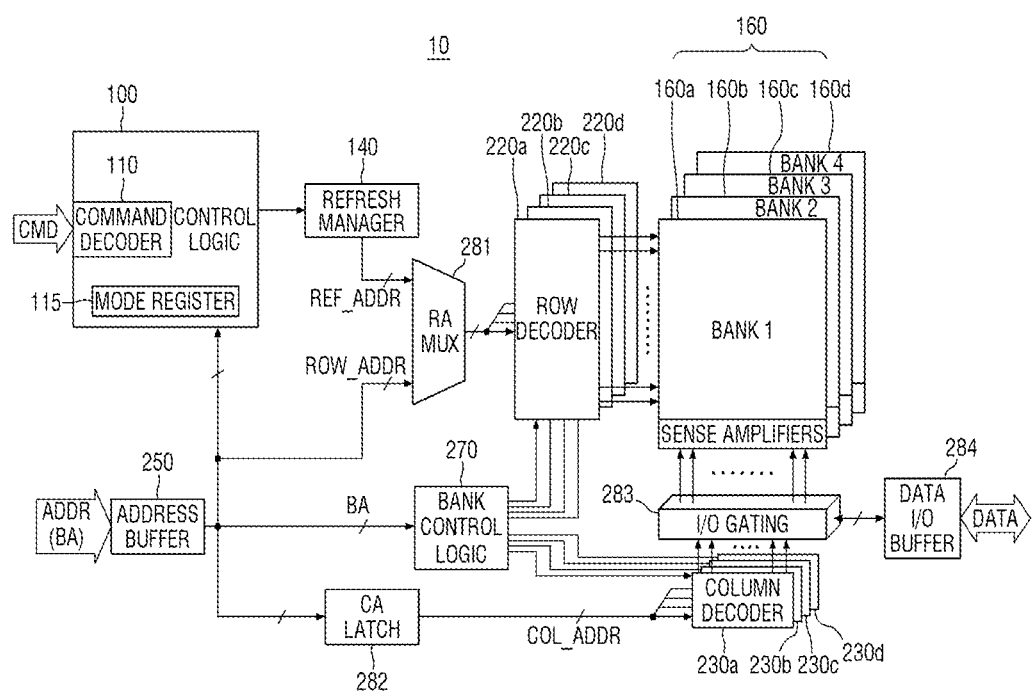
FIG. 2 is an example block diagram illustrating a memory device according to some embodiments.

FIG. 2 is an example block diagram illustrating a memory device according to some embodiments. Referring to FIG. 2, the memory device 10 may include a control logic 100, a refresh manager 140, a memory cell array 160, a plurality of row decoders 220a to 220d, a plurality of column decoders 230a to 230d, an address buffer 250, a bank control logic 270, a row address selector 281, a column address latch 282, an input/output gating circuit 283 and a data input/output buffer 284. In addition, the memory cell array 160 may include a plurality of banks 160a to 160d, and a plurality of sense amplifiers corresponding to the plurality of banks 160a to 160d may be disposed in the memory cell array 160.

The memory device 10 may be a dynamic random access memory (DRAM) such as a Double Data Rate Synchronous Dynamic Random Access Memory (DDR SDRAM)), a Low Power Double Data Rate (LPDDR) SDRAM, a Graphics Double Data Rate (GDDR) SDRAM, and a Rambus Dynamic Random Access Memory (RDRAM).

The control logic 100 may control an overall operation of the memory device 10, and may include a command decoder 110, a mode register 115 and a refresh manager 140. The control logic 100 may generate control signals to perform a write operation or a read operation in accordance with the command CMD from the memory controller (FIGS. 1 and 20). The control logic 100 may generate control signals for the refresh operation for the first to fourth banks 160a to 160d in accordance with the refresh command from the memory controller (FIGS. 1 and 20). Alternatively, the control logic 100 may generate control signals for the refresh operation for the first to fourth banks 160a to 160d in a self-refresh mode. The mode register 115 may include a plurality of registers that store information for setting an operating environment of the memory device 10. The command decoder 110 may output the access or the refresh command to the refresh manager 140 based on the command CMD. In one example, when the command CMD is the active command, the command decoder 110 may output the access to the refresh manager 140, and when the command CMD is the refresh command, the command decoder 110 may output the refresh command to the refresh manager 140.

The address buffer 250 may receive the address ADDR provided from the memory controller 20. The address ADDR may include a bank address BA. The address ADDR may also include a row address ROW_ADDR for indicating a row of the memory cell array 160, and a column address COL_ADDR for indicating a column. The row address ROW_ADDR may be provided to the row decoders 220a to 220d through the row address selector 281, and the column address COL_ADDR may be provided to the column decoders 230a to 230d through the column address latch 282. The bank address BA may be provided to the bank control logic 270. In one embodiment, the row address ROW_ADDR may be provided to the refresh manager 140, and the refresh manager 140 may determine whether to perform the row hammer handling operation based on the row address ROW_ADDR.

The bank control logic 270 may generate bank control signals in response to the bank address BA. In addition, in response to the bank control signals, one of the first to fourth row decoders 220a to 220d, which corresponds to the bank address BA, may be activated, and one of the first to fourth column decoders 230a to 230d, which corresponds to the bank address BA, may be activated. Each of the first to fourth banks 160a to 160d may include a plurality of bit lines and a plurality of word lines. The word lines having the same row address in different banks may be commonly connected, but ground selection lines may be separated from each other. For example, a wordline having a first row address ROW_ADDR1 in Bank 1 may be commonly connected to a wordline having a first row address ROW_ADDR1 in Bank 2.

The refresh manager 140 may output a row hammer handling enable signal EN_RHH to the refresh manager 140 in response to the refresh command. The refresh manager 140 may generate a refresh address REF_ADDR for selecting a memory cell row to be refreshed in the memory cell array 160 based on the row hammer handling enable signal En_RHH. In one example, when the refresh manager 140 outputs a logic high as the row hammer handling enable signal En_RHH to perform the row hammer handling operation, the refresh manager 140 may output an address of a predetermined adjacent memory cell row as the refresh address REF_ADDR.

Figure 3:
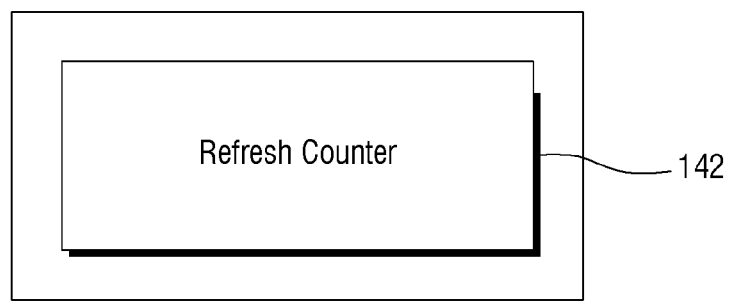
FIG. 3 is a block diagram illustrating a refresh manager, which may be used in the embodiments of FIGS. 1 and 2.

FIG. 3 is a block diagram illustrating the refresh manager of FIGS. 1 and 2. Referring to FIG. 3, the refresh manager 140 may include a refresh counter 142. The refresh counter 142 may count a number of word lines on which a refresh operation is performed. For example, if a refresh operation is performed on a first word line among a plurality of word lines in the memory cell array 160, the refresh counter 142 may increase a count (or count value) such that a next refresh operation is performed on a second word line adjacent to the first word line. Here, the first word line may be located adjacent to the second word line among the plurality of word lines constituting the memory cell array 160. However, the one or more embodiments are not limited thereto, and the count value may be increased such that a next refresh operation is performed on a word line that is not adjacent to the first word line that has been refreshed. In other words, the count value may be used to select a word line on which refresh operation is to be performed. Alternatively or additionally, the count (or count value) may be used such that the count value selects one or more word lines associated with a CSL to be refreshed. Alternatively or additionally, a first count may be associated with selecting a word line among the plurality of word lines, and a second count may be associated with selecting a CSL among a plurality of CSLs.

According to some embodiments, a plurality of word lines are respectively connected to a plurality of bit lines, and the plurality of bit lines may be grouped such that each group of bit lines is associated with each of a plurality of column select lines (CSL). For example, a first group of bit lines may output first data through CSL=0, and a second group of bit lines may output second data through CSL=1, and so on.

When the count value reaches a maximum threshold value, memory operations (e.g., precharge operation and read/write operations) may be performed on the memory cell array 160. Here, the maximum threshold value may be a predetermined value according to a number of word lines or a number of column select lines (CSL).

Figure 4:
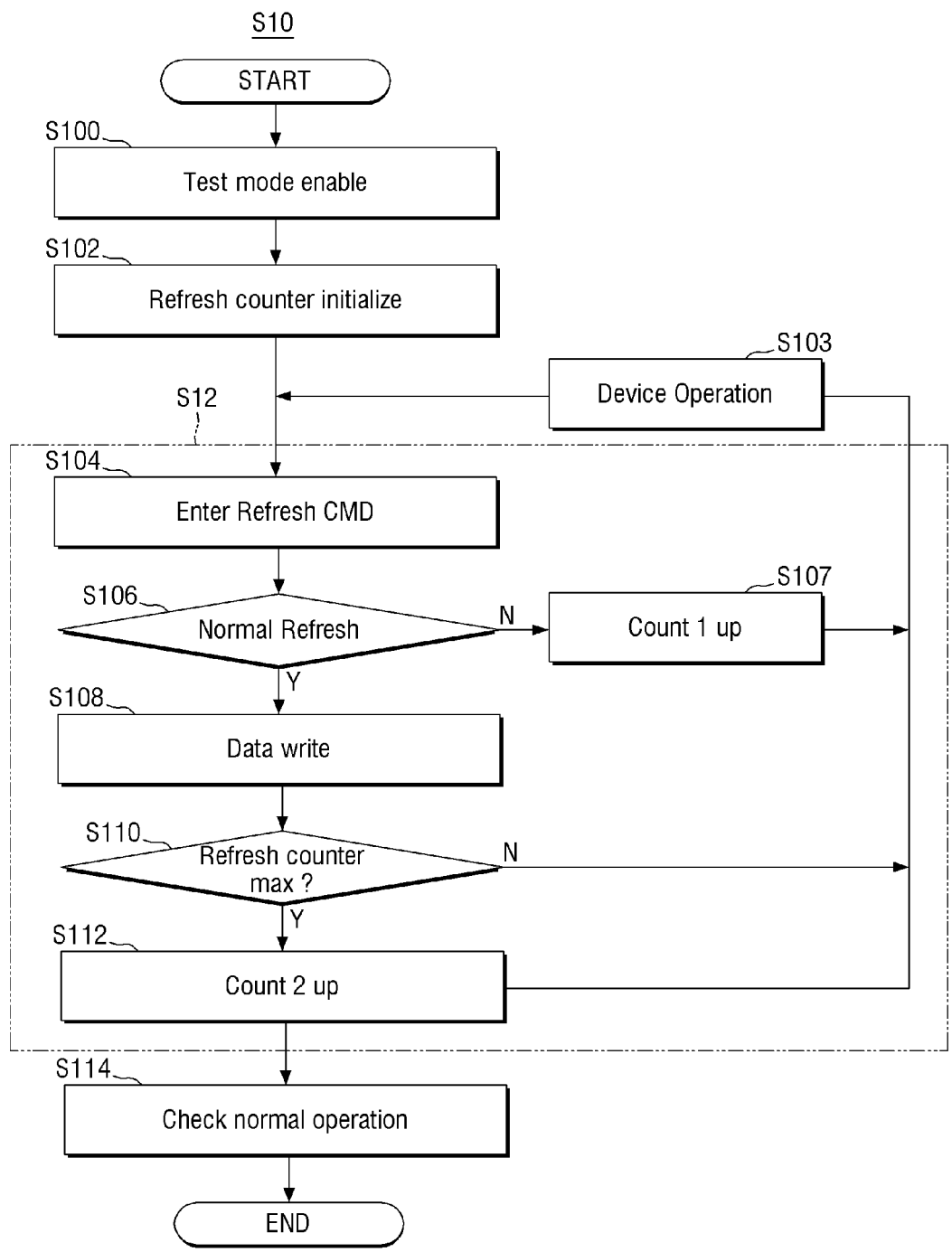
FIG. 4 is a flow chart illustrating an operation method of a memory device according to some embodiments.

FIG. 4 is a flow chart illustrating an operation method of a memory device according to some embodiments. Referring to FIGS. 1 to 4, the refresh manager 140 first activates (or enables) a test mode for the memory cell array 160 (S100). In this case, the test mode may be activated by mode register sets (MRS) according to, for example, Joint Electron Device Engineering Council (JEDEC) Specification. For example, a testing device (e.g., an automatic test equipment (ATE)) may be used to test the memory device 10. In such case, the testing device may issue a command to the memory device to enter the test mode. In S102, the refresh manager 140 initializes a refresh counter of the memory cell array 160. In more detail, a count of a row (e.g., word line) constituting the memory cell array 160 may be initialized.

In S104, the refresh manager 140 is activated when the refresh command of the commands is received from an external device (e.g., a tester and/or a system for evaluating the memory), and enters the refresh command to the memory cell array 160. According to an embodiment, a refresh command may be issued by the tester to the memory controller 20, and the memory controller 20 may transmit the refresh command to the memory device 10. In S106, the refresh manager 140 determines whether the refresh command for the memory cell array 160 is a normal refresh (S106). When the refresh command for the memory cell array 160 is a normal refresh (S106: Y), the refresh manger 140 writes data corresponding to the refresh in the memory cell array 160 (S108). Here, the data may be test data generated by a testing device. The refresh manager 140 determines whether the count of the row has reached a maximum threshold value (S110). When the count of the row has reached a maximum threshold value (S110: Y), the refresh manager 140 increases the count of the row constituting the memory cell array 160 by 2 (S112), whereby $CSL_{new}=CSL_{prior}+2$. Here, the count of the row is increased by 2 because the refresh operation is performed according to normal refresh operation. In other words, a wordline or wordlines associated with a CSL that is skipped may not be vulnerable to row hammer attack, as such, the count (or count value) may be increased by 2 to speed up the refresh operation. For example, when a refresh operation is performed on first wordlines associated with a first CSL according to normal refresh operation, a second CSL (including second wordlines associated with the second CSL) adjacent to the first CSL may not be vulnerable to row hammer attacks, so the count value may be increased by 2 to refresh a third CSL. However, the one or more embodiments are not limited thereto, and the count value may be increased by any number greater than equal to 1. Thereafter, the refresh manager 140 checks whether the write operation after the normal refresh has been normally performed (S114). That is, the refresh manager 140 may check the data (or test data) written into a given row of the memory cell array 160 to determine whether the normal refresh operation is accurately performed.

According to an embodiment, the refresh manager 140 determines whether the refresh command for the memory cell array 160 is a normal refresh (S106), and when the refresh command is not a normal refresh (S106: N), the refresh manager 140 increases the count of the row (e.g., word line) constituting the memory cell array 160 by 1 (S107), whereby $CSL_{new}=CSL_{prior}1$. Based on the $CSL_{new}$, the memory device performs device operation (S103). For example, the device operation may include precharge operation, read/write operations, and other operations of a memory device.

When a new refresh command is entered into the refresh manager 140, the refresh manager 140 is activated again, and enters the refresh command to the cell array 160 (S104). The memory cell array 160 determines whether the count of the memory cell array 160, more specifically, the count of the row (e.g., word line) constituting the memory cell array 160, has reached a maximum threshold value (S110). When the count of the row has not reached the maximum threshold value (S110: N), the refresh manager 140 enters the refresh command for the memory cell array 160 to the memory cell array 160 (S104).

When the count of the memory cell array 160, more specifically, the count of the row (e.g., word line) constituting the memory cell array 160, reaches a maximum value (S110: Y), the refresh manager 140 increases the count of the row constituting the memory cell array 160 by 2 and at the same time enters the refresh command for the memory cell array 160 to the memory cell array 160 (S104).

Figure 5:
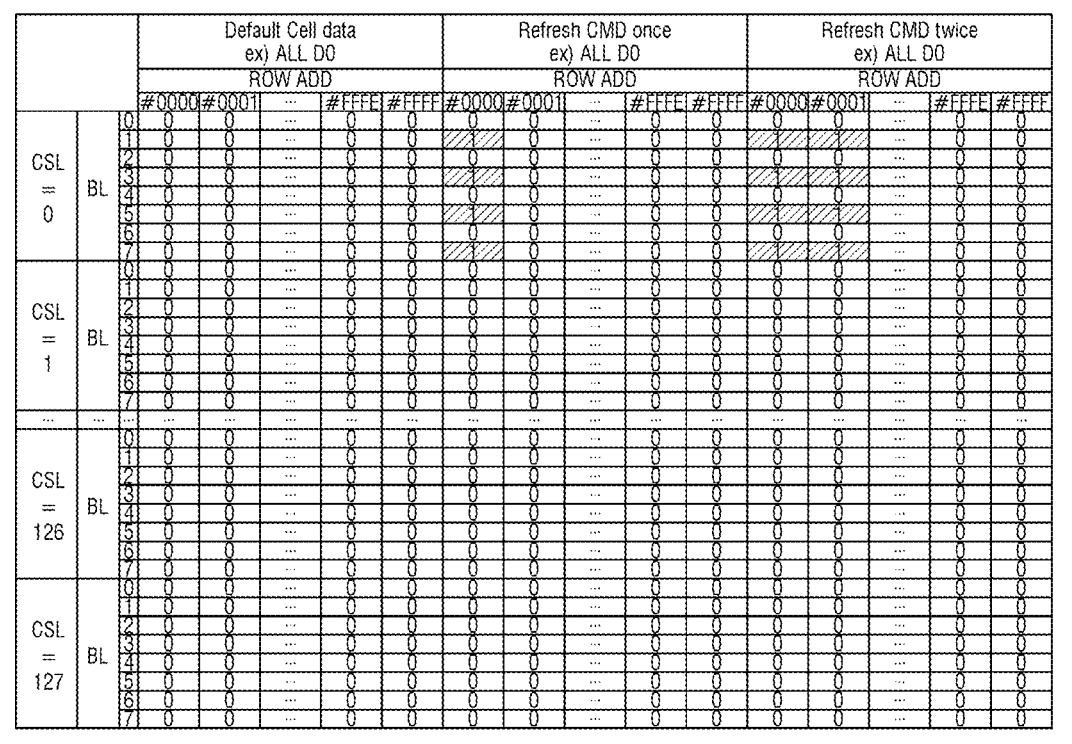

FIGS. 5 and 6 are tables illustrating an operation method of a memory device according to some embodiments. Referring to FIGS. 1 and 5-6, it is assumed that eight bit lines (0th to seventh bit lines) of each of the banks 160a to 160d are connected to each of a plurality of column select lines (0th (CSL=0) to 127th (CSL=127)) and a plurality of word lines (#0000 to #FFFF) are connected to the respective bit lines.

The refresh manager 140 first activates a test mode for the memory cell array 160. Next, the refresh manager 140 initializes the count of the memory cell array 160. For example, it is assumed that cell data are all designated as 0. Data for a row address (e.g., word line) are all initialized to 0.

Next, a case in which the refresh manager 140 enters the refresh command for the memory cell array 160 to the memory cell array 160 once will be described. According to some embodiments, in a test mode, the refresh manager 140 may input first data (e.g., 01010101) generated by a testing device, to a word line address #0000 associated with the 0th CSL (e.g., CSL=0) when the normal refresh operation is performed for the memory cell array. The input data may be, for example, data indicating temperature information of a thermometer in the memory.

Thereafter, when the refresh count is not a maximum value in the 0th CSL, the refresh manager 140 may enter the refresh command to the memory cell array 160. In this case, when the normal refresh operation is performed for the memory cell array as described above, the refresh manager 140 may input the first data (e.g., 01010101) to the word line address #0001 associated with the 0th CSL. The input data may be, for example, data indicating temperature information of a thermometer in the memory.

When it is determined that the normal refresh operation is not to be performed on the memory cell array, for example, when it is determined that the refresh operation is required due to row hammering, the refresh manager 140 may input row hammer refresh data (e.g. 10101010) to a word line address #FFFD associated with the first CSL (e.g., CSL=1) and a word line address #FFFF associated with the first CSL. The above description is described assuming that row hammering has occurred on the word line #FFFE. After inputting the row hammer refresh data to the word line addresses #FFFD and #FFFF, the memory device may read the row hammer refresh data from the word line addresses #FFFD and #FFFF, and the read row hammer refresh data may be output to a testing device. Based on the received row hammer refresh data, the testing device may determine whether a refresh operation is being performed accurately when a row hammering occurs on the word line #FFFE.

Figure 7:
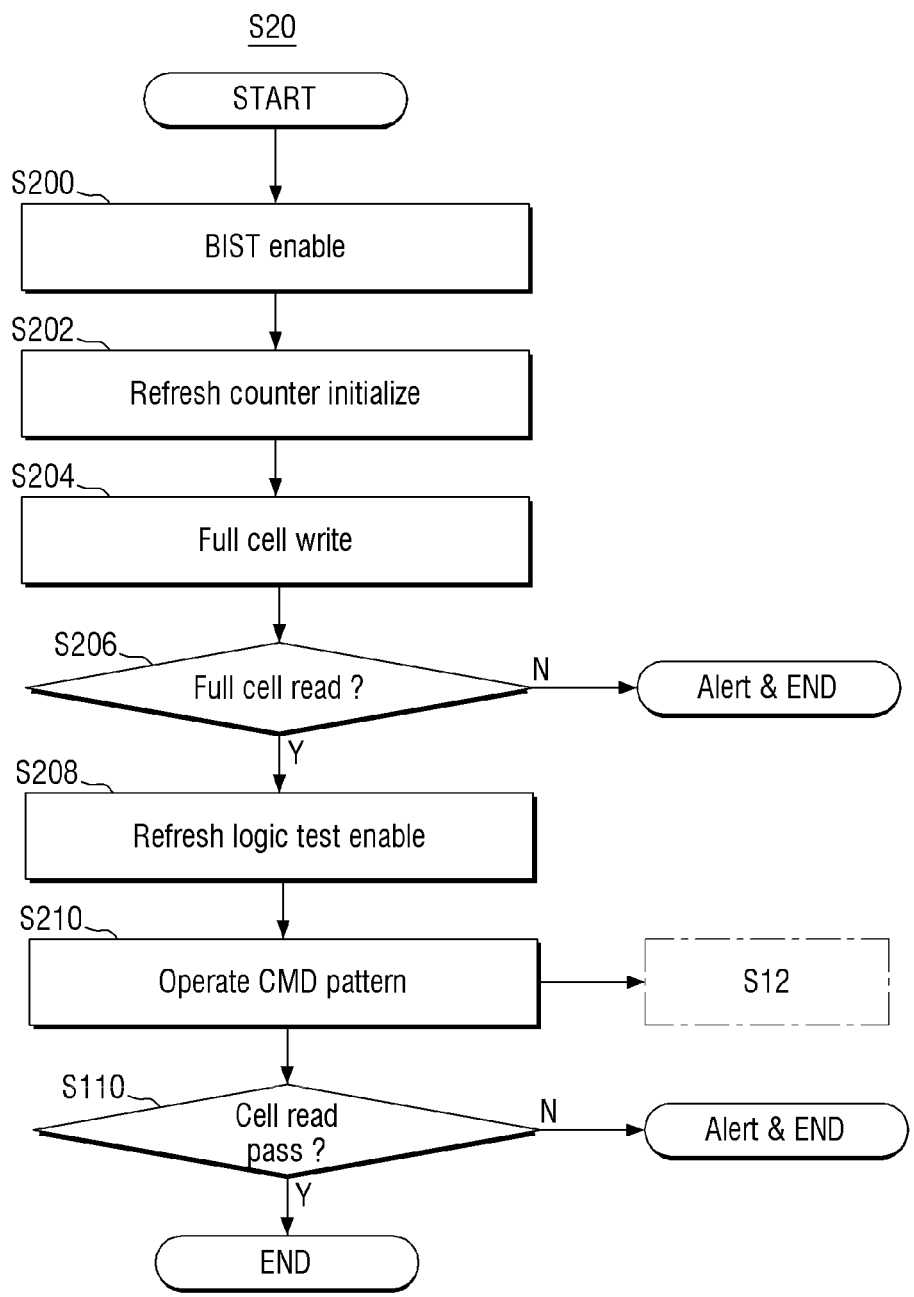
FIG. 7 is a flow chart illustrating another operation of a memory device according to some embodiments.

FIG. 7 is a flow chart illustrating an operation of a memory device according to some embodiments. Referring to FIGS. 1 to 3 and 7, the memory device according to some embodiments may operate in a Built-In Self-Test (BIST) environment. In S200, a memory device according to some embodiments activates BIST. In S202, the refresh manager 140 initializes a counter for the memory cell array 160.

In S204, a full cell write is performed on memory cell arrays (S204). For example, the refresh manager 140 may write data to a given wordline of the memory cell array. Here, the write data may be test data received from a testing device. In S206, the refresh manager 140 determines whether a read operation is performed on all memory cells of the memory cell array. When the read operation for all cells of the memory cell array has not been performed (S206: N), a user may be alerted and the BIST operation may be stopped. However, when the read operation for all cells of the memory cell array has been performed (S206: Y), the refresh logic test operation S12 described with reference to FIG. 4 is activated (S208).

Afterwards, a command pattern for the memory cell array is operated. Then, the refresh logic test operation S12 described with reference to FIG. 4 is performed. Also, the refresh manager 140 determines whether a read operation of the cells of the memory cell array has passed (S110).

When the read operation for the cells of the memory cell array has passed (S110: Y), the operation of the memory device according to some embodiments ends. However, when the read operation for the cells of the memory cell array has not passed (S110: N), the user may be alerted and the BIST operation may be stopped.

Through the refresh verification operation described above, verification for the refresh operation may be efficiently performed, and reliability of the refresh operation may be improved.

Although the embodiments of the present disclosure have been described above with reference to the accompanying drawings, the present disclosure is not limited to the aforementioned embodiments, and may be implemented in various forms different from the embodiments of the disclosure. It will be understood by a person having an ordinary knowledge in the technical field to which the present disclosure pertains that the present disclosure may be embodied in other specific forms without changing the technical spirit or essential features of the present disclosure. Accordingly, the embodiments mentioned above are to be considered in all respects as illustrative rather than restrictive.

What is claimed is:

1. A memory device, comprising:
    a memory cell array including a plurality of rows; and
    a refresh manager configured to:
        initialize a count for a row among the plurality of rows of the memory cell array;
        transmit a refresh command to the memory cell array;
        write first data into the row when the refresh operation for the memory cell array is a normal refresh operation; and
        write second data into at least one word line adjacent to a word line of a row on which row hammering has occurred, when the refresh operation is not the normal refresh operation.

2. The memory device of claim 1, wherein the refresh manager further configured to activate a test mode prior to the count for the row of the memory cell array is initialized.

3. The memory device of claim 2, wherein the test mode is indicated by a mode register set (MRS) according to a Joint Electron Device Engineering Council (JEDEC) Specification.

4. The memory device of claim 1, wherein the first data is written into the word line of the row among the plurality of word lines.

5. The memory device of claim 1, wherein the first data is written into a word line associated with at least a portion of a plurality of column select lines (CSL).

6. The memory device of claim 1, wherein, when the count reaches a maximum threshold value after the first data is written, a count of the first column select line (CSL) is increased by 2.

7. The memory device of claim 6, wherein after the count of the first CSL is increased by 2, the refresh manager is further configured to determine whether the refresh command is normally operated.

8. An operation method of a memory device, the operation method comprising:
- initializing a count of a row among a plurality of rows of a memory cell array;
- transmitting a refresh command to the memory cell array;
- writing first data into the row when a refresh operation for the memory cell array is a normal refresh operation; and
- writing second data into at least one word line adjacent to a word line of a row on which row hammering occurs, when the refresh operation is not the normal refresh operation.

9. The operation method of claim 8, further comprising activating a test mode prior to initializing the count of the row of the memory cell array.

10. The operation method of claim 9, wherein the test mode is indicated by a mode register set (MRS) according to a Joint Electron Device Engineering Council (JEDEC) Specification.

11. The operation method of claim 8, wherein the first data is written into the word line of the row among the plurality of word lines.

12. The operation method of claim 8, wherein the first data is written into a word line associated with at least a portion of a plurality of column select lines.

13. The operation method of claim 8, wherein, when the count reaches a maximum threshold value after the first data is written, a count of a first column select line (CSL) among a plurality of CSLs is increased by 2.

14. The operation method of claim 13, further comprising determining whether the refresh command is normally operated, after the count of the first CSL is increased by 2.

15. A memory system comprising:
- a memory controller; and
- a memory device configured to receive an operation command from the memory controller,
the memory device comprising:
- a memory cell array including a plurality of rows, and a refresh manager configured to:
  - initialize a count for a row among the plurality of rows of the memory cell array;
  - transmit a refresh command to the memory cell array;
  - write first data into the row when the refresh operation for the memory cell array is a normal refresh operation; and
  - write second data into at least one word line adjacent to a word line of a row on which row hammering has occurred, when the refresh operation is not the normal refresh operation.

16. The memory system of claim 15, wherein the refresh manager is further configured to activate a test mode prior to the count for the row of the memory cell array is initialized.

17. The memory system of claim 16, wherein the test mode is indicated by a mode register set (MRS) according to a Joint Electron Device Engineering Council (JEDEC) Specification.

18. The memory system of claim 16, wherein the first data is written into the word line of the row among the plurality of word lines.

19. The memory system of claim 16, wherein the first data is written into a word line associated with at least a portion of a plurality of column select lines (CSL).

20. The memory system of claim 19, wherein, when the count reaches a maximum threshold value after the first data is written, a count of a first CSL, is increased by 2.

* * * * *